United States Patent [19]

Hayashi

[11] Patent Number: 5,698,874
[45] Date of Patent: Dec. 16, 1997

[54] PHOTOELECTRIC CELL HAVING FIRST AND SECOND INSULATED GATES ON FIRST AND SECOND CHANNEL FORMING REGIONS

[75] Inventor: Yutaka Hayashi, Kanagawa, Japan

[73] Assignee: Sony Corporation, Tokyo, Japan

[21] Appl. No.: 742,445

[22] Filed: Nov. 1, 1996

Related U.S. Application Data

[63] Continuation of Ser. No. 332,732, Nov. 1, 1994, abandoned.

[30] Foreign Application Priority Data

Nov. 2, 1993 [JP] Japan .................................. 5-297400
Aug. 12, 1994 [JP] Japan .................................. 6-211960

[51] Int. Cl.[6] .................. H01L 27/148; H01L 31/06
[52] U.S. Cl. ................ 257/233; 257/292; 257/232; 257/461; 257/462
[58] Field of Search .................. 250/214.1; 257/222, 257/223, 224, 225, 228, 291, 292, 233, 461, 462, 232, 290

[56] References Cited

U.S. PATENT DOCUMENTS

| | | | |
|---|---|---|---|
| 4,831,426 | 5/1989 | Kimata et al. | 257/233 |
| 5,060,042 | 10/1991 | Shinohara et al. | 257/290 |
| 5,124,544 | 6/1992 | Ohzu | 257/462 |
| 5,191,399 | 3/1993 | Maegawa et al. | 257/233 |

*Primary Examiner*—Minh-Loan Tran
*Attorney, Agent, or Firm*—Hill, Steadman & Simpson

[57] ABSTRACT

A photoelectric cell of the present invention comprises a first conduction type first semiconductor region; a second conduction type second semiconductor region formed in the surface of the first semiconductor region so as to form a pn junction together with the first semiconductor region; a first conductive region formed in the surface of the first semiconductor region so as to be separated from the second semiconductor region and to form a first rectifier junction together with the first semiconductor region; a second conductive region formed in the surface of the first semiconductor region so as to be separated from the first conductive region and to be electrically connected to the second semiconductor region to form a second rectifier junction together with the first semiconductor region; a third conductive region formed in the surface of the second semiconductor region so as to form a third rectifier junction together with the second semiconductor region; a first insulated gate formed on a first channel forming region in the surface of the first semiconductor region defined between the first conductive region and the second conductive region on and a second insulated gate formed on a second channel forming region in the surface of the second semiconductor region defined between the first semiconductor region and the third conductive region.

7 Claims, 5 Drawing Sheets

FIG. I
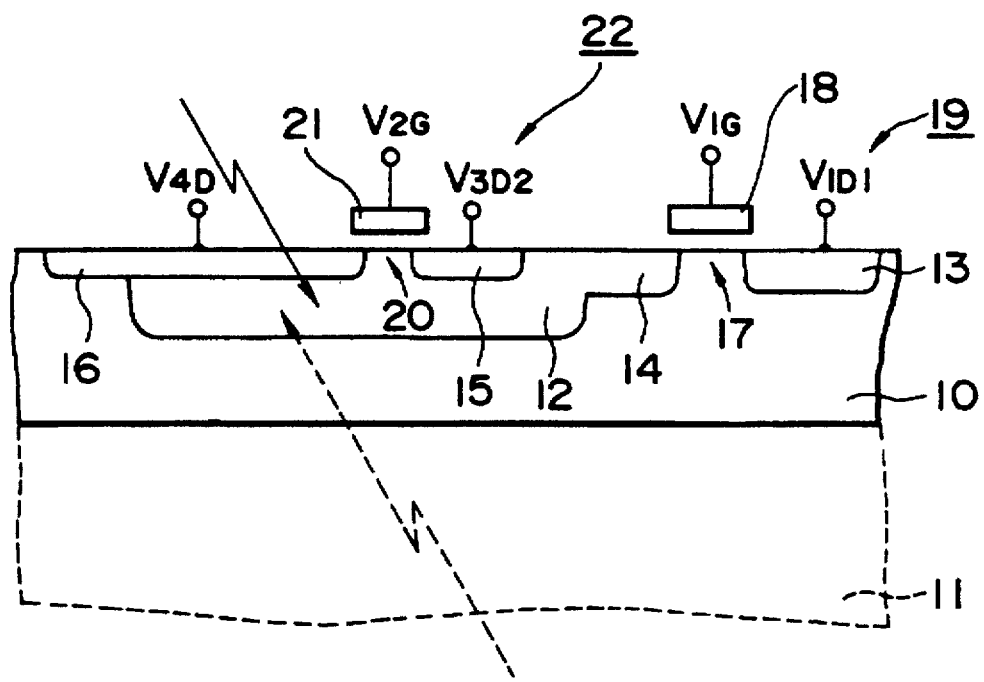
FIG. 2
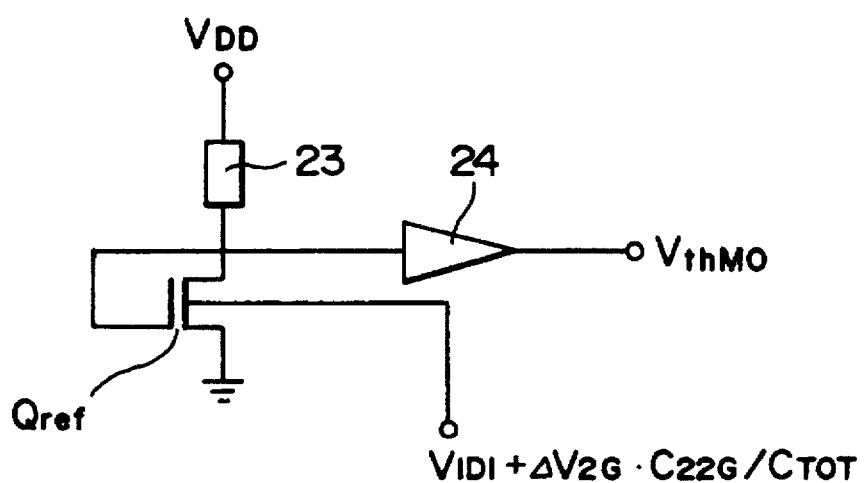

FIG. 7
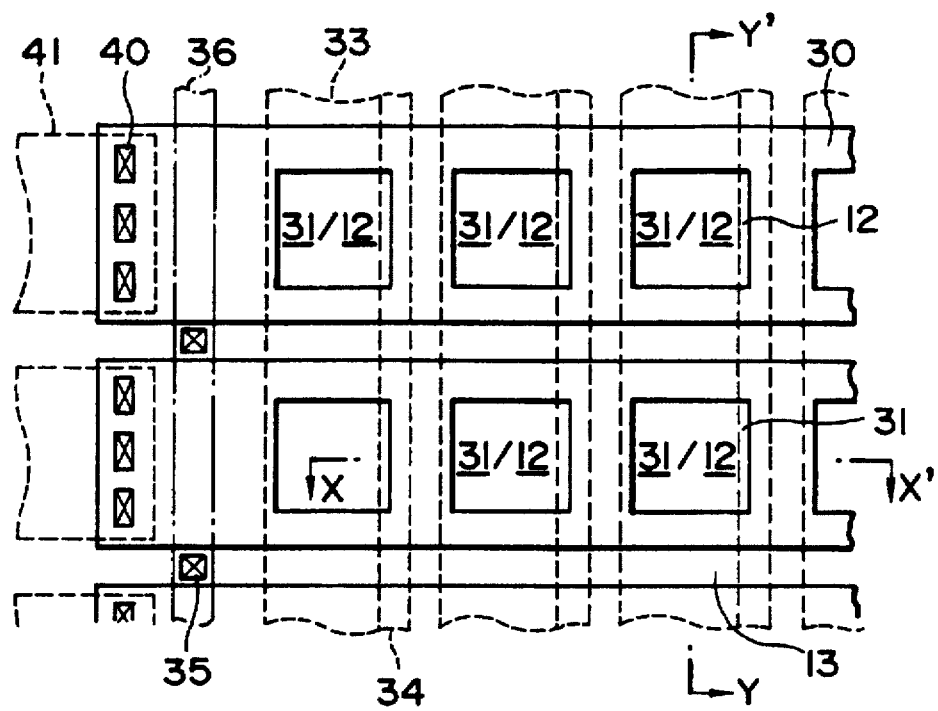
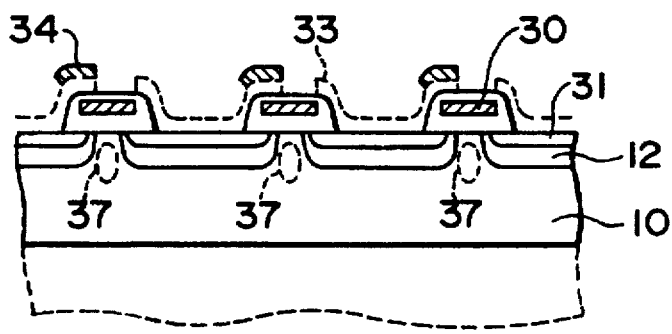
FIG. 8A
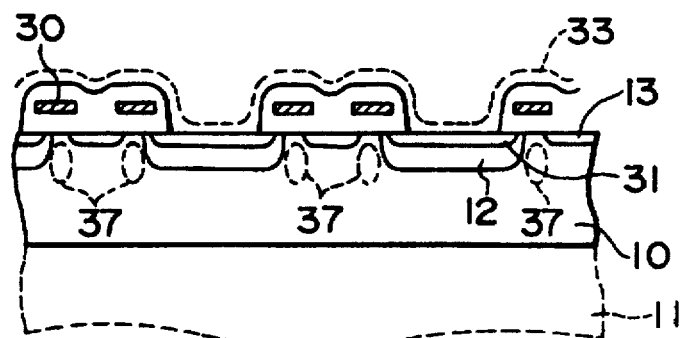
FIG. 8B

PHOTOELECTRIC CELL HAVING FIRST AND SECOND INSULATED GATES ON FIRST AND SECOND CHANNEL FORMING REGIONS

This is a continuation, of application Ser. No. 08/332,732, filed Nov. 1, 1994, now abandoned.

BACKGROUND OF THE INVENTION

The present invention relates to a photoelectric cell having an amplification function and, more particularly, to a photoelectric cell suitable for use as a pixel of a solid-state imaging device.

Improvements have been made in the transfer noise characteristic and the amplification noise characteristic of CCDs (charge-coupled devices), which are representative solid-state imaging devices, to deal with the increase of the numbers of pixels and the reduction of the area of pixels in CCDs, however, the reduction of transfer noise and amplification noise has almost reached a limit. Meanwhile, various amplified solid-state imaging devices comprising cells having a function to amplify optical signals provided by photoelectric converters have been developed and published in papers. Representative amplified solid-state imaging devices are AMIs (amplified MOS intelligent imagers), SIT (static induction transistor) solid-state imaging devices and CMDs (charge modulation devices).

FIG. 9A is a sectional view of one pixel of an AMI and FIG. 9B is a circuit diagram of on pixel of the AMI. Each pixel of the AMI comprises three FETs, i.e., a transistor $T_a$ for amplification, a transistor $T_y$ for vertical scanning and a transistor $T_{rs}$ for resetting, and one photodiode D. Holes and electrons of electron-hole pairs excited by incident light are absorbed respectively by the p$^+$-region of the photodiode D and the substrate. Consequently, the absolute value of the potential of the photodiode D reset to an initial value decreases according to the intensity of the incident light. The potential of the photodiode D is applied to the gate of the amplifying transistor $T_a$ for amplification and an output is provided through the vertical scanning transistor $T_y$ and a horizontal scanning switch, not shown. After the reading of the row has been completed, the next row is selected and the resetting transistor $T_{rs}$ is turned on for one horizontal scanning interval to reset the potential of the photodiode D to the initial value.

FIG. 10A is a sectional perspective view of a pixel of a SIT solid-state imaging device, and FIG. 10B is a circuit diagram of the pixel. Each pixel of the SIT solid-state imaging device comprises a static induction transistor $T_r$ and a capacitor C connected to the gate of the static induction transistor $T_r$. In this SIT solid-state imaging device, incident light generates holes and electrons in a depletion layer, the electrons flow toward the substrate and the holes flow toward the p$^+$-gate PG. Since the p$^+$-gate is preset at a negative potential and is in the state of a floating electrode, the potential of the p$^+$-gate increases as the holes gather around the p$^+$-gate PG. When the row is selected by a horizontal scanning circuit, not shown, after charge has been stored for 1/60 sec in this state, the potential of the p$^+$-gate PG is raised through the capacitor C to a read potential $V_{rd}$. When the pixel is selected by a vertical scanning circuit, not shown, and a read voltage is applied to the pixel, a current limited by the depletion layer formed according to the potential of the p$^+$-gate PG is provided. After the reading of the row has been completed, the potential of the p$^+$-gate PG is decreased to the reset potential $V_{rs}$ for resetting.

FIG. 11A is a sectional perspective view of a pixel of a CMD and FIG. 11B is a circuit diagram of the pixel. Each pixel of the CMD comprises a single transistor for photoelectric conversion, amplification, reading and resetting. Since the CMD operates as a bulk channel MOS transistor, the depletion layer extends to the p-SUB and electrons do not flow when a high negative voltage is applied to the gate while the pixel is charged. Holes excited by incident light gather under the gate electrode to form an inversion layer. The inversion layer reduces the thickness of the depletion layer, so that an electron current corresponding to the quantity of incident light can easily flow. When a voltage of a read level is applied to the gate to select the pixel, an electron current flows across the source and the drain and an output current modulated according to the number of holes is provided. After the reading of the row has been completed, a reset voltage is applied to the gate in the horizontal blanking interval so that the electrons are stored under the gate to reset the holes stored under the gate.

Since the pixel of the AMI among the foregoing three amplified solid-state imaging devices comprises three transistors and one photodiode, the AMI has a complicated construction, a large area and a small numerical aperture.

The SIT solid-state imaging device comprises pixels each comprising a static induction transistor and a capacitor connected to the gate of the static induction transistor, and has a high sensitivity. However the SIT solid-state imaging device is costly because the same needs a high-purity epitaxial wafer. Furthermore, the fabrication of the SIT solid-state imaging device requires techniques different from ordinary techniques for fabricating MOSLSIs, and a high-performance SIT solid-state imaging device cannot be fabricated by ordinary designing techniques and an ordinary MOSLSI fabricating line.

The CMD is costly because each pixel of the CMD is a MOSFET that stored light-induced holes in the surface of an n-type depletion channel and causes a flow of corresponding electrons, and this MOSFET needs a high-purity epitaxial wafer. Furthermore, a considerably high negative voltage must be applied to the gate of the MOSFET to store optical information, it is difficult to incorporate the CMD into a MOSLSI of a submicron design rule.

Recent progressive increase in the manufacturing cost of LSIs has begun to threaten the existence of LSI manufacturers and it has been expected to develop a photoelectric converter capable of being fabricated by a fabricating process having steps common to the fabrication of the photoelectric converter and that of the LSI to improve investment efficiency and capable of being fabricated at a comparatively low manufacturing cost.

SUMMARY OF THE INVENTION

The present invention has been made in view of the aforesaid problems and it is therefore an object of the present invention to provide a photoelectric cell capable of being fabricated on an ordinary MOSLSI manufacturing line, not needing an epitaxial wafer having a specially high purity, and compatible with techniques relating to submicron MOSLSIs in construction, material parameters and voltage level.

A photoelectric cell in a first aspect of the present invention comprises a first conduction type first semiconductor region; a second conduction type second semiconductor region formed in the surface of the first semiconductor region so as to form a pn junction together with the first semiconductor region; a first conductive region formed in the surface of the first semiconductor region so as to be separated from the second semiconductor region and to form a first rectifier junction together with the first semiconductor region; a second conductive region formed in the surface of the first semiconductor region so as to be separated from the first conductive region and to be electrically connected to the second semiconductor region to form a second rectifier junction together with the first semiconductor region; a third conductive region formed in the surface of the second semiconductor region so as to form a third rectifier junction together with the second semiconductor region; a first insulated gate formed on a first channel forming region in the surface of the first semiconductor region defined between the first conductive region and the second conductive region and a second insulated gate formed on a second channel forming region in the surface of the second semiconductor region defined between the second semiconductor region and the third conductive region.

A photoelectric cell in a second aspect of the present invention comprises, in addition to the components of the photoelectric cell in the first aspect of the present invention, at least a fourth conductive region formed in the surface of the second semiconductor region so as to be separated from the third conductive region and to form a fourth rectifier junction together with the second semiconductor region, and the second insulated gate is formed on the second channel forming region in the surface of the second semiconductor region defined between the third conductive region and the fourth conductive region.

In a photoelectric cell in a third aspect of the present invention in accordance with the first or the second aspect of the present invention, the second conductive region and the second semiconductor region share a common semiconductor region.

A photoelectric cell in a fourth aspect of the invention comprises: a first conduction type first semiconductor region; a second conduction type second semiconductor region formed in the surface of the first semiconductor region so as to form a pn junction together with the first semiconductor region; a first conductive region formed in the surface of the first semiconductor region so as to be separated from the second semiconductor region and to form a first rectifier junction; a second conductive region formed in the surface of the second semiconductor region so as to form a third rectifier junction together with the second semiconductor region; and a common insulated gate formed on a channel forming region in the surface of the first semiconductor region defined between the surface of the second semiconductor region and the first conductive region and on a channel forming region in the surface of the second semiconductor region defined between the surface of the first semiconductor region and the third conductive region.

In the photoelectric cell in the first aspect of the present invention, a field-effect transistor for writing (hereinafter referred to as "write transistor") is formed by using the first conductive region as a drain/source, the second conductive region as a source/drain, the first insulated gate as a gate, and the surface of the first semiconductor region between the first and the second conductive region as a channel forming region, and a field-effect transistor for storage (hereinafter referred to as "memory transistor") is formed by using the first semiconductor region as a source/drain, the third conductive region as a drain/source, the second insulated gate as a gate, and the surface of the second semiconductor region between the surface of the first semiconductor region and the third conductive region as a channel forming region. In the memory transistor, the intensity of the incident light is converted into the potential of the second semiconductor region, and the drain-source current of the memory transistor or the gate threshold voltage is sensed.

In the photoelectric cell in the second aspect of the present invention, a memory transistor is formed by using the fourth conductive region as a source/drain, the third conductive region as a drain/source, the second insulated gate as a gate, and the surface of the second semiconductor region between the third and the fourth conductive region as a channel forming region. In this memory transistor, the intensity of incident light is converted into the potential of the second semiconductor region, and the drain-source current of the memory transistor or the gate threshold voltage is sensed.

In the photoelectric cell in the third aspect of the present invention, a write transistor is formed by using the first conductive region as a drain/source, the second semiconductor region as a source/drain, the first insulated gate as a gate, and the surface of the first semiconductor region between the first conductive region and the second semiconductor region as a channel forming region.

In the photoelectric cell in the fourth aspect of the present invention, a write transistor is formed by using the first conductive region as a drain/source, the second semiconductor region as a source/drain, the common insulated gate as a gate, and the surface of the first semiconductor region between the surface of the second semiconductor region and the first conductive region as a channel forming region, and a memory transistor is formed by using the third conductive region as a drain/source, the first semiconductor region as a source/drain, the common insulated gate as a gate, and the surface of the second semiconductor region between the surface of the first semiconductor region and the third conductive region as a channel forming region. In this memory transistor, the intensity of the incident light is converted into the potential of the second semiconductor region, and the drain-source current of the memory transistor or the gate threshold voltage is sensed.

The photoelectric cell of the present invention can be fabricated by using a semiconductor wafer as a starting material and by ordinary LSI fabricating techniques including ordinary epitaxial growth techniques and the like including thermal oxidation, lithography, ion implantation, solid-phase diffusion, CVD and sputtering, does not need an epitaxial wafer having a specially high purity, and is well compatible with submicron MOSLSI techniques in respect of construction, material parameters and voltage level. Thus, the photoelectric cell of the present invention having an amplifying function can be fabricated at a reduced manufacturing cost.

BRIEF DESCRIPTION OF THE DRAWINGS

The above and other objects, features and advantages of the present invention will become more apparent from the following description taken in connection with the accompanying drawings, in which:

FIG. 1 is a schematic sectional view of a photoelectric cell in a first embodiment according to the present invention;

FIG. 2 is a circuit diagram of a $V_{thMO}$ generating circuit;

FIG. 7 is a plan view of a photoelectric cell in a fourth embodiment according to the present invention;

FIGS. 8A and 8B are a sectional view taken on line X–X' in FIG. 7 and a sectional view taken on line Y–Y' in FIG. 7, respectively;

DETAILED DESCRIPTION OF THE PREFERRED EMBODIMENTS

Figure 3:
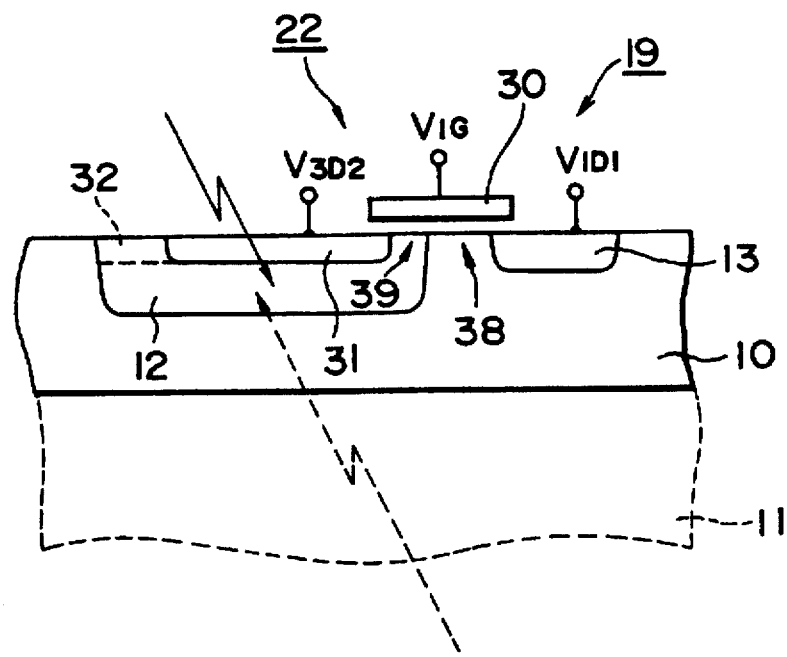
FIG. 3 is a schematic sectional view of a photoelectric cell in a second embodiment according to the present invention.

Referring to FIG. 1, a photoelectric cell in a first embodiment according to the present invention has a semiconductor wafer serving as a first conduction type first semiconductor region 10. The first semiconductor region 10 may be a semiconductor region formed in the surface of a semiconductor wafer 11 indicated by broken lines or a semiconductor film formed on an insulating substrate. A second conduction type second semiconductor region 12 of a conduction type opposite that of the first semiconductor region 10 is formed in a portion of the surface of the first semiconductor region 10 to form a pn junction between the first semiconductor region 10 and the second semiconductor region 12. A first conductive region 13 and a second conductive region 14 are formed in separate portions of the surface of the first semiconductor region 10. The first conductive region 13 and the second conductive region 14 are formed of a low-resistance semiconductor of the second conduction type or silicide. Rectifier junctions are formed between the first conductive region 13 and and the first semiconductor region 10 and between the second conductive region 14 and the first semiconductor region 10, respectively. The second conductive region 14 is formed integrally with the second semiconductor region 12 or the second conductive region 14 and the second semiconductor region 12 share a common semiconductor region to connect the second conductive region 14 electrically to the second semiconductor region 12. A third conductive region 15 is formed of a low-resistance semiconductor of the first conduction type or silicide in a portion of the surface of the second semiconductor region 12, and a third rectifier junction is formed between the second semiconductor region 12 and the third conductive region 15. A fourth conductive region 16 is formed across a portion of the first semiconductor region 10 and a portion of the second semiconductor region 12 so as to be spaced apart from the third conductive region 15. The fourth conductive region 16 is formed of a low-resistance semiconductor of the first conduction type or silicide. A rectifier junction is formed between the second semiconductor region 12 and the fourth conductive region 16. The fourth conductive region 16 may be formed only in a portion of the second semiconductor region 12 or across the second semiconductor region 12 and the second conductive region 14. Essentially, the fourth conductive region 16 has at least a portion formed in a portion of the second semiconductor region 12. A conductive first insulated gate 18 is formed on an insulating film, not shown, such as an oxide film, a nitride film or an oxide-nitride film, formed on a first channel forming region 17 in the surface of the first semiconductor region 10 defined between the first conductive region 13 and the second conductive region 14. The first insulated gate 18 is a polycrystalline silicon film, a silicide film, a salicide film, a metal thin film or a transparent conductive film. A conductive second insulated gate 21 is formed on an insulating film, not shown, such as an oxide film, a nitride film or an oxide-nitride film, formed on a second channel forming region 20 in the surface of the semiconductor region 12 defined between the third conductive region 15 and the fourth conductive region 16. The second insulated gate 21 is a polycrystalline silicon film, a silicide film, a salicide film, a metal thin film or a transparent conductive film.

A write transistor 19 is formed by using the first conductive region 13 as a drain/source, the second conductive region 14 as a source/drain, the first semiconductor region 18 as a gate, and a portion of the first insulated region 10 between the first conductive region 13 and the second conductive region 14 as the first channel forming region 17. A memory transistor 22 is formed by using the third conductive region 15 as a drain/source, the fourth conductive region 16 as a source/drain, the second insulated gate 21 as a gate, and a portion of the surface of the semiconductor region 12 between the third conductive region 15 and the fourth conductive region 16 as the second channel 20.

Incident light falls on the surface of the photoelectric cell and reaches the second semiconductor region 12. The second semiconductor region 12 stores the energy of the incident light in electric charge and the potential of the second semiconductor region 12 increases. When the thickness of the first semiconductor region 10 is smaller than the diffusion length of minority carriers or when the first semiconductor region 10 is formed on the semiconductor wafer 11, the semiconductor wafer 11 is transparent and the thickness of the first semiconductor region 10 is smaller than the diffusion length of minor carriers, the incident light may fall on the back surface of the photoelectric cell as indicated by broken lines.

The operation of the photoelectric cell in the first embodiment will be described hereinafter on an assumption that the first conduction type is an n-type.

A first voltage $V_{1D1}$ (for example, −3.5 V) is applied to the first conductive region 13. A second gate voltage $V_{1G2}$ (for example, −5 V) is applied to the first insulated gate 18, and then the potential of the first insulated gate 18 is returned to the first gate voltage $V_{1G1}$ (for example, 0 V). Then, when the threshold voltage $V_{thW}$ of the first insulated gate 18 is 1.5 V or below, the write transistor 19 is turned on, so that the first voltage $V_{1D1}$ applied to the first conductive region 13 is supplied to the second conductive region 14. In this state, the voltage $V_2$ of the second semiconductor region 12 is substantially equal to the first voltage $V_{1D1}$ because the second semiconductor region 12 is electrically connected to the second conductive region 14. More strictly, $$V_2 = V_{1D1} - (V_{1D1} + V_{thW} - V_{1G1}) \cdot C_{2D1G}/C_{TOT} \quad (1)$$

$$C_{TOT} = C_{21} + C_{23D} + C_{24D} + C_{22G} + C_{2D1} + C_{2D1G} \quad (2)$$

where $C_{21}$ is the junction capacitance between the second semiconductor region 12 and the first semiconductor region 10, $C_{23D}$ is the junction capacitance between the second semiconductor region 12 and the third conductive region 15, $C_{24D}$ is the junction capacitance between the second semiconductor region 12 and the fourth conductive region 16, $C_{22G}$ is the capacitance between the second semiconductor region 12 and the second insulated gate 21, $C_{2D1}$ is the junction capacitance between the second conductive region 14 and the first semiconductor region 10, and $C_{2D1G}$ is the capacitance between the second conductive region 20 and the first insulated gate 18.

A second voltage $V_{3D2}$ (for example, +1.5 V) is applied to the third conductive region 15. In this state the charge $Q_2$ stored in the second semiconductor region 12 is:

$$Q_2 = C_{21}(V_2 - V_1) + C_{23D}(V_2 - V_{3D}) + C_{24D}(V_2 - V_{4D}) + \quad (3)$$
$$C_{22G}(V_2 - V_{2G}) + C_{2D1}(V_{2D} - V_1) + C_{2D1G}(V_{2D} - V_{1G})$$

where $V_1$, $V_2$, $V_{2D}$, $V_{3D}$, $V_{4D}$, $V_{1G}$ and $V_{2G}$ are the potentials of the first semiconductor region 10, the second semiconductor region 12, the second conductive region 14, the third conductive region 15, the fourth conductive region 16, the first insulated gate 18 and the second insulated gate 21, respectively.

Suppose, for convenience' sake, that $V_1 = V_{4D} = 0$, $V_{1G} = 0$ and $V_{2D} = V_2$. Then, $$Q_2 = C_{21}V_2 + C_{23D}(V_2 - V_{3D}) + C_{24D}V_2 + C_{22G}(V_2 - V_{2G}) + \quad (4)$$
$$C_{2D1}V_2 + C_{2D1G}V_2 = C_{TOT}V_2 - C_{23D}V_{3D} - C_{22G}V_{2G}$$

Therefore, $$V_2 = Q_2/C_{TOT} + (C_{23D}V_{3D} - C_{22G}V_{2G})/C_{TOT} \quad (5)$$

Although those capacitances are voltage-dependent, it is presumed herein that those capacitances are constant for simplicity. Suppose that a current $i_{ph}$ flows into the second semiconductor region 12 when incident light falls on the photoelectric cell and dark current is $i_d$, $$Q_2 = Q_{20} + \int_0^t (i_{ph} + i_d) dt \quad (6)$$

where $Q_{20}$ is the initial charge. Supposing that $i_{phm}$ is the mean value of the current $i_{ph}$ in the integration time, $$V_2 = V_{1D1} + (i_{phm} + i_d)t/C_{TOT} + \Delta V_{2G} \cdot C_{22G}/C_{TOT} \quad (7)$$

Expression (7) shows that the higher the intensity of the incident light, the greater is change in the potential $V_2$ of the second semiconductor region 12 in a fixed time from the setting of the initial potential. In expression (7), $\Delta V_{2G}$ = (A change in the potential of the second  (8)

inuslated gate 21 after the initial potential has been set) −

$(V_{1D1} + V_{thW} - V_{1G1}) * C_{2D1G}/C_{22G}$

The gate threshold voltage $V_{thM}$ of the memory transistor 22 is a function of the potential difference $V_2$ between the second semiconductor region 12 serving as the channel forming region 20, and the fourth conductive region (source) 16, which is expressed most simply by:

$$V_{thM} = V_{FB} + 2\phi_{FB} + B(2\phi_{FB} - V_2)^{1/2} \quad (9)$$

$$B = (t_1/\epsilon_1)(2q\epsilon_s N_{2m})^{1/2} \quad (10)$$

where $\phi_{FB}$ is the Fermi level (level with respect to the center of the forbidden band in an energy band) of a portion of the second semiconductor region 12 in which a channel is formed, i.e., the channel forming region 20, $\epsilon_1$ is the dielectric constant of the gate insulating film, $t_1$ is the thickness of the gate insulating film, $\epsilon_s$ is the dielectric constant of the channel forming region 20, and $N_{2m}$ is the mean impurity density of the surface depletion region of the channel forming region 20.

When a given voltage is applied to the second insulated gate 21, a memory transistor current $I_M$ flows between the third conductive region 15 and the fourth conductive region 16 of the memory transistor 22. This memory transistor current $I_M$ is expressed by:

$$I_M = (\beta/2)(V_{2G} - V_{thM})^p$$

$p = 1$ to 2  (11)

$\beta = (\mu\epsilon_1/t_1)$  (12)

The gate voltage $V_{2G}$ of the photoelectric cell can be selectively determined according to the purpose of use of the photoelectric cell. For example, suppose that $V_{thMO}$ is the gate threshold voltage of the memory transistor 22 at the setting of the initial potential (the voltage $V_2$ when $t=0$ in expression (7) is used for convenience' sake) and $V_{2G} = V_{thMO}$. Then, the transistor current $I_M$ that flows through the memory transistor 22 is:

$$I_M = (\beta/2)(V_{thMO} - V_{thM})^p \quad (13)$$
$$= (\beta/2)\{B (2\phi_{FB} - V_2(t=0))^{1/2} - B (2\phi_{FB} - V_2)^{1/2}\}^p$$
$$= (\beta/2) [B(i_{phm} + i_d)t/C_{TOT}/ \{(2\phi_{FB} - V_2(t=0))^{1/2} + (2\phi_{FB} - V_2)^{1/2}\}]^p$$

That is, the intensity of the current $I_M$ that flows through the memory transistor 22 is proportional to the product of the photocurrent $i_{phm}$ and the detection time or to the square of the same product.

A voltage differing from the gate threshold voltage by a fixed difference can be known by reading a voltage at which the current $I_M$ of the memory transistor 22 coincides with a specified value by sweeping the gate voltage $V_{2G}$ of the second insulated gate 21. The intensity of the photocurrent can be determined from this voltage, the voltage $V_2$ of expression (7) and the gate threshold voltage $V_{thM}$ of expression (9). In this state, a sawtooth voltage is applied to the second insulated gate 21.

Factors determining the sensitivity of the photoelectric cell are the dark current $i_d$, the dispersion of the gate threshold voltage and the temperature characteristic. The influence of the dark current $i_d$ on the sensitivity of the photoelectric cell is the same as that of the dark current on the sensitivity of the conventional photoelectric cell. Problems attributable to the dispersion of the gate threshold voltage and temperature variation can be solved to some extent by incorporating a $V_{thMO}$ generating circuit into a chip in which the photoelectric cell is formed.

Referring to FIG. 2 showing a $V_{thMO}$ generating circuit by way of example, the $V_{thMO}$ generating circuit is provided with a transistor $Q_{ref}$ for generating a $V_{thMO}$. The construction of the transistor $Q_{ref}$ is the same as that of the memory transistor 22 of FIG. 1. The $V_{thMO}$ generating transistor $Q_{ref}$ has a source connected to a ground, and a drain to which a supply voltage $V_{DD}$ is applied through a current setting device 23. The current setting device 23 determines a current that flows when the gate voltage of the transistor $Q_{ref}$ is equal to a threshold voltage $V_{th}$. The channel forming region of the $V_{thMO}$ generating transistor $Q_{ref}$ is biased by a bias voltage $V_{BIAS}$ expressed by:

$$V_{BIAS} = V_{1D1} + \{V_{thMO} \cdot C_{22G} - (V_{1D1} + V_{thW} - V_{1G1}) \cdot C_{2D1G}\}/C_{TOT} \quad (14)$$

An output voltage obtained from the drain through an impedance converter 24 is used as the voltage $V_{thMO}$ for determining the bias voltage $V_{BIAS}$.

In a solid-state imaging device having a memory array formed by arranging a plurality of photoelectric cells identical with the photoelectric cell in this embodiment, the gate threshold voltages $V_{thMO}$ of the photoelectric cells vary from photoelectric cell to photoelectric cell. However, the correction of detection signals may be improved by one figure or so when the detection signals are corrected on the basis of information about the dispersion of the gate threshold voltages $V_{thMO}$ stored in the memory array.

The first insulated gate 18 and the second insulated gate 21 may be connected to the same address line because the voltage to be applied to the first insulated gate 18 in setting the initial potential and the gate voltage to be applied to the second insulated gate 21 in reading the memory transistor 22 are different from each other in polarity. The bias voltage $V_{BIAS}$ for biasing the channel forming region of the $V_{thMO}$ generating transistor $Q_{ref}$ is:

$$V_{BIAS}=V_{1D1}+\{V_{thMO}-(V_{1D1}+V_{thW}-V_{1G1})\}\cdot C_{22G}/C_{TOT} \quad (15)$$

Although the memory transistor 22 of the photoelectric cell in this embodiment is formed by using the fourth conductive region 16 formed in a portion of the surface of the second semiconductor region 12 as the source/drain, the third conductive region 15 as the drain/source, the second insulated gate 21 as the gate, and a portion of the surface of the second semiconductor region 12 between the third conductive region 15 and the fourth conductive region 16 as the second channel forming region, the first semiconductor region 10 and the fourth conductive region 16 may share a common region and the memory transistor 22 may be formed by using the first semiconductor region 10 as the source/drain, the third conductive region 15 as the drain/source, the second insulated gate 21 as the gate, and a portion of the surface of the second semiconductor region 12 between the surface of the first semiconductor region 10 and the third conductive region 15 as the second channel forming region.

A photoelectric cell in a second embodiment according to the present invention will be described hereinafter with reference to FIG. 3, in which parts like or corresponding to those previously described with reference to FIG. 1 are designated by the same reference characters. In the second embodiment, a second semiconductor region 12 corresponding to the second semiconductor region 12 of the first embodiment and a second conductive region share a common region, a first semiconductor region 10 and a fourth conductive region 16 share a common region, a first insulated gate 18 and a second insulated gate 21 share a common insulated gate 30. Thus the photoelectric cell in the second embodiment is substantially the same in size as one transistor. In this photoelectric cell, a portion of the first semiconductor region 10 under the common insulated gate 30 corresponds to the fourth conductive region 16 of the first embodiment, and a conductive region 31 formed in a portion of the surface of the second semiconductor region 12 is a third conductive region. A heavily doped surface region 32 is formed in a portion of the second semiconductor region 12, not including the conductive region 31 and not covered with the common insulated gate 30. The heavily doped surface region 32 is formed to prevent the accidental inversion of the surface of the semiconductor region 12.

A write transistor 19 is formed by using the first conductive region 13 as a drain/source, the second semiconductor region 12 as a source/drain, the common insulated gate 30 as a gate, and a portion of the surface of the first semiconductor region 10 between the first conductive region 13 and the surface of the second semiconductor region 12 as the first channel forming region 38, and a memory transistor 22 is formed by using the third conductive region 31 as a drain/source, the first semiconductor region 10 as a source/drain, the common insulated gate 30 as a gate, and a portion of the surface of the second semiconductor region 12 between the third conductive region 31 and the surface of the first semiconductor region 10 as a second channel forming region 39.

The operation of the photoelectric cell in the second embodiment will be described on an assumption that the first conduction type is the n-type.

A first voltage $V_{1D1}$ (for example, −3.5 V) is applied to the first conductive region 13. A second gate voltage $V_{1G2}$ (for example, −5 V) is applied to the common insulated gate 30, and then the voltage of the common insulated gate 30 is returned to the first gate voltage $V_{1G1}$ (for example, 0V. Then, the first voltage $V_{1D1}$ of the first conductive region 13 is supplied to the second semiconductor region 12 with the write transistor 19 being turned on when the absolute value of the gate threshold voltage $V_{thW}$ of the transistor formed by using the common insulated gate 30 as the gate, the first conductive region 13 and the second semiconductor region 12 as the source/drain, and a portion of the surface of the first semiconductor region 10 between the first conductive region 13 and the surface of the second semiconductor region 12 as the channel forming region is 1.5 V or below. In this state, the voltage $V_2$ of the second semiconductor region 12 is approximately equal to the first voltage $V_{1D1}$. Strictly, the voltage $V_2$ is:

$$V_2=V_{1D1}-(V_{1D1}+V_{thW}-V_{1G1})\cdot C_{22D}/C_{TOT} \quad (16)$$

$$C_{TOT}=C_{21}+C_{23D}+C_{22G} \quad (17)$$

where $C_{21}$ is the junction capacitance between the second semiconductor region 12 and the first semiconductor region 10, $C_{23D}$ is the junction capacitance between the second semiconductor region 12 and the third conductive region 31, and $C_{22G}$ is the overlap capacitance between the second semiconductor region 12 and the common insulated gate 30. An initial potential is set by the foregoing operation. A second voltage $V_{3D2}$ (for example, +1.5 V) is applied to the third conductive region 31. The charge $Q_2$ stored in the second semiconductor region 12 in this state is:

$$Q_2=C_{21}(V_2-V_1)+C_{23D}(V_2-V_{3D})+C_{22G}(V_2-V_{2G}) \quad (18)$$

where $V_1$, $V_2$, $V_{3D}$ and $V_{2G}$ are the potentials of the first semiconductor region 10, the second semiconductor region 12, the third conductive region 31 and the common insulated gate 30, respectively.

Suppose that $V_1=0$ and $V_{1G1}$ (the initial value of $V_{2G}$)=0. Then, $$Q_2=C_{21}V_2+C_{23D}(V_2-V_{3D})+C_{22G}(V_2-V_{2G})=C_{TOT}V_2-C_{23D}V_{3D}-C_{22G}V_{2G} \quad (19)$$

Therefore, $$V_2=Q_2/C_{TOT}+(C_{23D}V_{3D}-C_{22G}V_{2G})/C_{TOT} \quad (20)$$

Although the capacitances are voltage-dependent, it is presumed herein that the capacitances are constant for simplicity.

Suppose that a current $i_{ph}$ flows into the second semiconductor region 12 when incident light falls on the photoelectric cell and dark current is $i_d$. Then, $$Q_2=Q_{20}+\int_0^t(i_{ph}+i_d)dt \quad (21)$$

where $Q_{20}$ is an initial charge. Supposing that the $i_{phm}$ is the mean value of the current $i_{ph}$ in the integration time, $$V_2=V_{1D1}+(i_{phm}+i_d)t/C_{TOT}+\Delta V_{2G}\cdot C_{22G}/C_{TOT} \quad (22)$$

Expression (22) shows that the higher the intensity of the incident light, the greater is the change in the potential $V_2$ of the second semiconductor region 12 in a fixed time from the setting of the initial potential. In expression (22), $$\Delta V_{2G} = \text{(A change in the potential of the common} \quad (23)$$

inuslated gate 30 after the initial potential has been set) –

$$(V_{1D1} + V_{tnW} - V_{1G1}) \cdot C_{2D1G}/C_{22G}$$

The gate threshold voltage $V_{thM}$ of the memory transistor 22 is a function of the potential difference $V_2$ between the second semiconductor region 12 serving as the channel forming region, and the first semiconductor region 11 serving as a source, which is expressed most simply by:

$$V_{thM} = V_{FB} + 2\phi_{FB} + B(2\phi_{FB} - V_2)^{1/2} \quad (24)$$

$$B = (t_1/\epsilon_1)(2q\epsilon_s N_{2m})^{1/2} \quad (25)$$

where $\phi_{FB}$ is the Fermi level (level with respect to the center of the forbidden band in an energy band) of a portion of the second semiconductor region 12 in which a channel is formed, i.e., the channel forming region 39, $\epsilon_1$ is the dielectric constant of the gate insulating film, $t_1$ is the thickness of the gate insulating film, $\epsilon_s$ is the dielectric constant of the channel forming region 39, and $N_{2m}$ is the mean impurity density of the surface depletion region of the channel forming region 39.

When a given voltage is applied to the common insulated gate 30, a memory transistor current $I_M$ of the memory transistor 22 flows between the third conductive region 31 and the surface of the first semiconductor region 10. This memory transistor current $I_M$ is expressed by:

$$I_M = (\beta/2)(V_{2G} - V_{thM})^p$$

$$p = 1 \text{ to } 2 \quad (26)$$

$$\beta = (\mu\epsilon_1/t_1)(W_M/LM) \quad (27)$$

The gate voltage $V_{2G}$ of the photoelectric cell can be selectively determined according to the purpose of use of the photoelectric cell. For example, suppose that $V_{thMO}$ is the gate threshold voltage (the voltage $V_2$ when t=0 in expression (22) for convenience' sake) of the memory transistor 22 at the setting of the initial potential (strictly, the gate voltage $V_{2G}$ is further applied to the common insulated gate 30) and $V_{2G} = V_{thMO}$. Then, the transistor current $I_M$ that flows through the memory transistor 22 is:

$$\begin{aligned}I_M &= (\beta/2)(V_{thMO} - V_{thM})^p \quad (28)\\ &= (\beta/2)\{B(2\phi_{FB} - V_2(t=0))^{1/2} - B(2\phi_{FB} - V_2)^{1/2}\}^p \\ &= (\beta/2)(\{B(i_{phm} + i_d)t/C_{TOT}/\{(2\phi_{FB} - V_2(t=0))^{1/2} + (2\phi_{FB} - V_2)^{1/2}\}\}^p \end{aligned}$$

That is, the intensity of the current $I_M$ that flows through the memory transistor 22 is proportional to the product of the photocurrent $i_{phm}$ and the detection time or to the square of the same product.

A voltage differing from the gate threshold voltage by a fixed difference can be known by reading a voltage at which the current $I_M$ of the memory transistor 22 coincides with a specified value by sweeping the gate voltage $V_{2G}$ of the common insulated gate 30. The intensity of the photocurrent can be determined from this voltage and expressions (22) and (24). In this state, a sawtooth voltage is applied to the common insulated gate 30.

Factors determining the sensitivity of the photoelectric cell are the dark current $i_d$, the dispersion of the gate threshold voltage and the temperature characteristic. The influence of the dark current $i_d$ on the sensitivity of the photoelectric cell is the same as that of the dark current on the sensitivity of the conventional photoelectric cell. Problems attributable to the dispersion of the gate threshold voltage and temperature variation, similarly to the problems in the first embodiment, can be solved to some extent by incorporating a $V_{thMO}$ generating circuit shown in FIG. 2 into a chip in which the photoelectric cell is formed. In the second embodiment, the channel forming region of the $V_{thMO}$ generating transistor $Q_{ref}$ is biased by a bias voltage expressed by:

$$V_{BIAS} = V_{1D1} + \{V_{thMO} - (V_{1D1} + V_{thW} - V_{1G1})\} \cdot C_{22G}/C_{TOT} \quad (29)$$

The second embodiment uses the third conductive region 31 as the drain of the memory transistor 22. In this case, it is desirable that at least a portion of the third conductive region 31 extending under the common insulated gate 30 is a comparatively lightly doped region, i.e., a lightly doped drain, having an impurity density in the range of $1 \times 10^{18}$ to $5 \times 10^{19}$ atoms/cm$^3$.

Although the first semiconductor region 10 serves as the source of the memory transistor, and the third conductive region 31 serves as the drain of the memory transistor under the foregoing biasing condition, the first semiconductor region 10 may be electrically isolated from the wafer to use the first semiconductor region 10 as a wiring region when the plurality of photoelectric cells in the second embodiment are arranged in an array to form a solid-state imaging device.

The third conductive region 31 may be negatively biased relative to the first semiconductor region 10 to use the first semiconductor region 10 as the drain of the memory transistor, and the third conductive region 31 as the source of the memory transistor.

Figure 4:
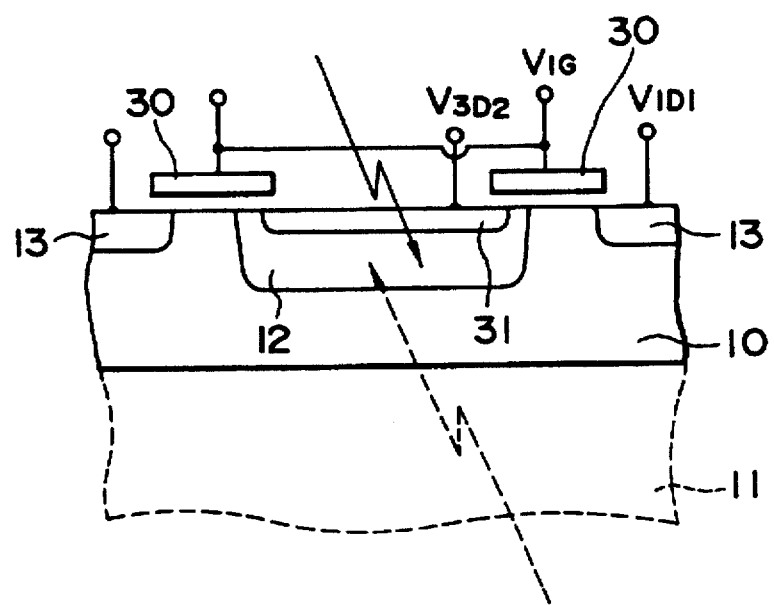
FIG. 4 is a schematic sectional view of a photoelectric cell in a third embodiment according to the present invention.

FIG. 4 shows a photoelectric cell in a third embodiment according to the present invention, in which parts like or corresponding to those previously described with reference to FIG. 3 are designated by the same reference characters. The photoelectric cell in the third embodiment is substantially the same in construction as the photoelectric cell in the second embodiment, except that the photoelectric cell in the third embodiment has a common insulated gate 30 formed so as to surround a second semiconductor region 12 substantially entirely. When thus constructed, the photoelectric cell does not need any region corresponding to the heavily doped region 32 of the photoelectric cell in the second embodiment, and the output current of the memory transistor thereof is enhanced.

When a solid-state imaging device is formed by arranging photoelectric cells identical with the photoelectric cell in the third embodiment in an array, the first conductive region 13 surrounding the second semiconductor region 12 absorbs light-induced carriers flooding from the adjacent pixels to prevents blooming. Blooming may be prevented by forming the first semiconductor region 10 contiguously with a third semiconductor region (or a wafer) 11 of a second conduction type, and forming a portion of the first semiconductor region between the second semiconductor region 12 and the third semiconductor region (or the wafer) 11 in a thickness smaller than the length of one side of the pixel to absorb light-induced carriers flooding from the first semiconductor region 10 of the pixel by the third semiconductor region (or the wafer) 11. This construction may be applied to the photoelectric cells in the first and the second embodiment shown in FIGS. 1 and 3.

Figure 5:
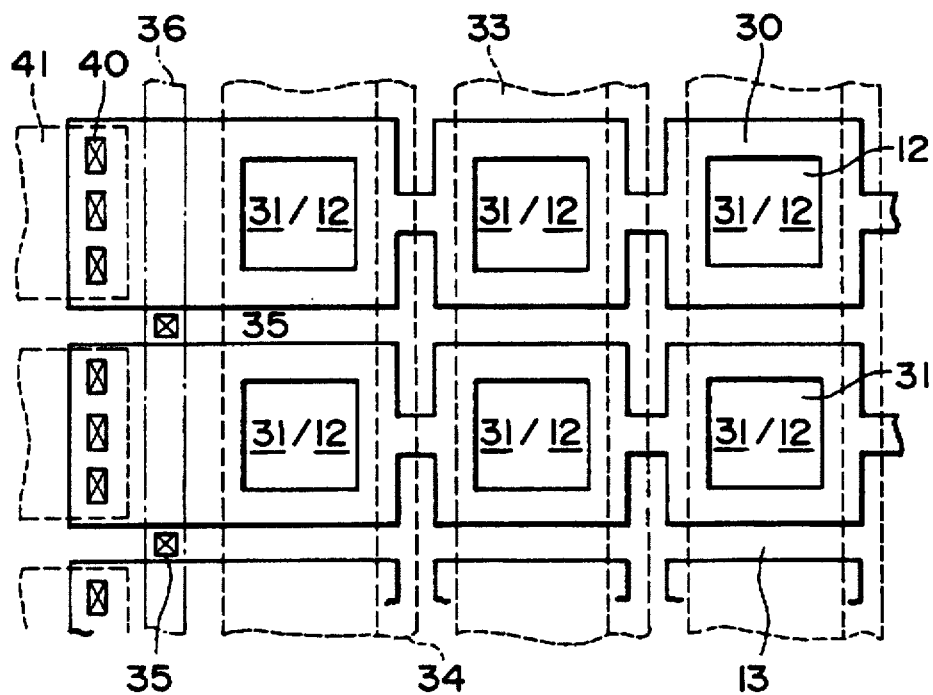
FIG. 5 is a plan view of the photoelectric cell of FIG. 4.

FIG. 5 is a plan view of a solid-state imaging device formed by integrating photoelectric cells identical with the photoelectric cell in the third embodiment. As shown in FIG.

5, a pattern of lead lines 33 connected to the third conductive regions 31 and extending along the columns of the pixels is formed over the second semiconductor regions 12 of the pixels. The lead lines 33 are formed by patterning a transparent conductive film of polycrystalline silicon heavily doped with an impurity, such as arsenic or phosphorous, indium oxide-tin, tin oxide, zinc oxide or the like, having a thickness in the range of 200 to 500 nm. Metal thin film wiring lines 34 are formed along the lead lines 33, respectively, to reduce the resistance of the wiring lines.

In this solid-state imaging device, the third conductive regions 31 of the pixels of each column are connected, and the common insulated gates 30 of the pixels in each row are connected. The pixels on the intersections of the lines parallel to the columns of the pixels and the lines parallel to the rows of the pixels are selected (XY-addressing) to read optical information obtained by the pixels through photoelectric conversion. The common insulated gates 30 at one end of the array of the pixels are connected through contact holes 40 to gate lines 41.

Figure 6:
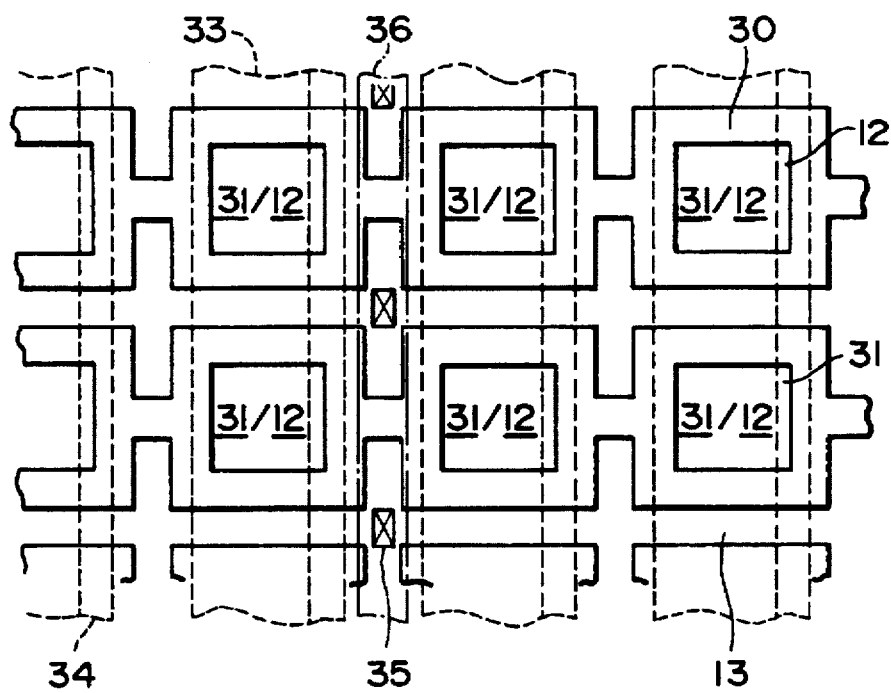
FIG. 6 is a plan view of a modification of the photoelectric cell of FIG. 4.
Figure 9A:
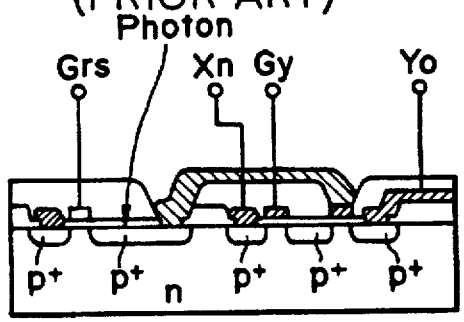
FIGS. 9A and 9B are a schematic sectional view and a circuit diagram, respectively, of an AMI.
Figure 9B:
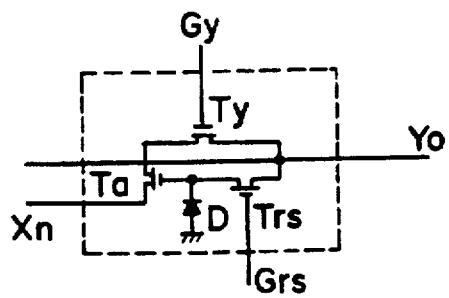
Figure 10A:
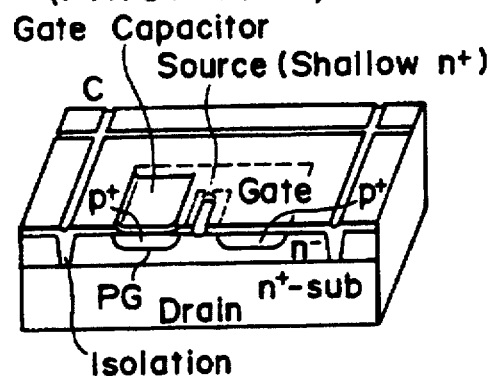
FIGS. 10A and 10B are a schematic sectional perspective view and a circuit diagram, respectively, of photoelectric cell of a SIT solid-state imaging device.
Figure 10B:
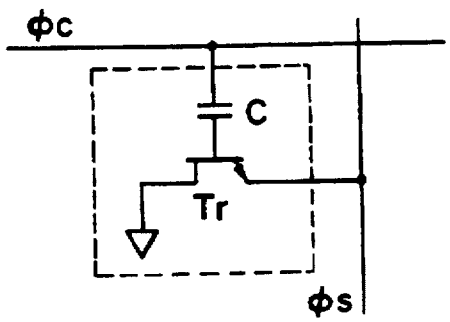
Figure 11A:
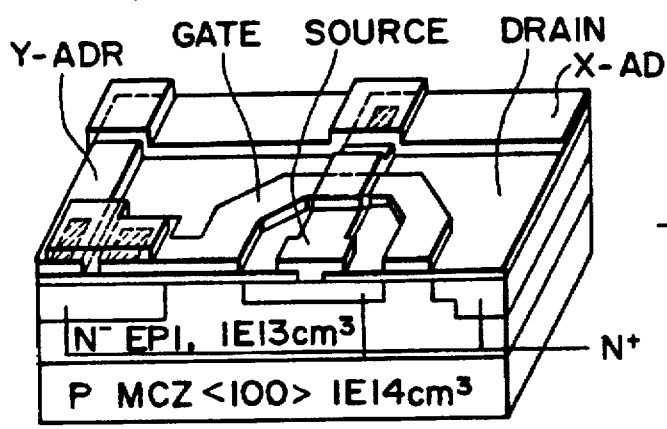
FIGS. 11A and 11B are a schematic sectional perspective view and a circuit diagram, respectively, of a photoelectric cell of a CMD.
Figure 11B:
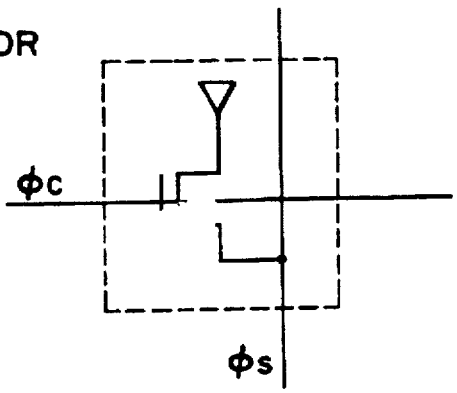

The first voltage $V_{1D1}$ is applied to the first conductive regions (source/drain) 13 through a metal thin film wiring line 36 and contact holes 35 at one end of the array. If the resistances of the first conductive regions 13 cause problems in the operation of the solid-state imaging device, metal thin film wiring lines 36 may be formed along the columns of the pixels between the adjacent columns of the pixels at appropriate intervals, and the first voltage $V_{1D1}$ may be applied to the first conductive regions 13 through contact holes 35 and the metal thin film wiring lines 36 as shown in FIG. 6.

FIGS. 7, 8A and 8B are a plan view and sectional views, respectively, of a solid-state imaging device formed by arranging a plurality of photoelectric cells in a fourth embodiment according to the present invention in an array. In this solid-state imaging device, portions of the first conductive regions 13 formed between the adjacent pixels in each row are omitted. This configuration increases the degree of integration of the photoelectric cells along the rows. When the solid-state imaging device is of a submicron design rule, a heavily doped region 37 must be formed in a portion of the first semiconductor region 10 between the adjacent second semiconductor regions 12 (FIG. 8A) and in a portion of the first semiconductor region 10 between the first conductive region and the second semiconductor region 12 (FIG. 8B) to prevent punch-through.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A photoelectric cell comprising:

a first conduction type first semiconductor region;

a second conduction type second semiconductor region formed in the surface of the first semiconductor region to form a pn junction together with the first semiconductor region;

a first conductive region formed in the surface of the first semiconductor region separated from the second semiconductor region to form a first rectifier junction together with the first semiconductor region;

a second conductive region formed in the surface of the first semiconductor region separated from the first conductive region to thereby form a second rectifier junction together with the first semiconductor region which is electrically connected to the second semiconductor region;

a third conductive region formed in the surface of the second semiconductor region to form a third rectifier junction together with the second semiconductor region;

a first insulated gate formed on a first channel forming region in the surface of the first semiconductor region between the first conductive region and the second conductive region; and a second insulated gate formed on a second channel forming region in the surface of said second semiconductor region defined between the first semiconductor region and the third conductive region.

2. A photoelectric cell according to claim 1, wherein a fourth conductive region is formed at least in the surface of the second semiconductor region so as to be separated from the third conductive region and to form a fourth rectifier junction together with the second semiconductor region, and the second insulated gate is formed on the second channel forming region in the surface of the second semiconductor region defined between the third conductive region and the fourth conductive region.

3. A photoelectric cell according to claim 2, wherein the second conductive region and the second semiconductor region share a common semiconductor region.

4. A photoelectric cell according to claim 1, wherein the second conductive region and the second semiconductor region share a common semiconductor region.

5. A photoelectric cell according to claim 1, wherein the first semiconductor region is formed contiguously with a second conduction type third semiconductor region, and a thickness of a portion of the first semiconductor region between the second semiconductor region, and the third semiconductor region is smaller than a length of one side of a pixel.

6. A photoelectric cell comprising:

a first conduction type first semiconductor region;

a second conduction type second semiconductor region formed in the surface of the first semiconductor region so as to form a p-n junction together with the first semiconductor region;

a first conductive region formed in the surface of the first semiconductor region so as to be separated from the second semiconductor region and to form a first rectifier junction together with the first semiconductor region;

a second conductive region formed in the surface of the second semiconductor region so as to form a second rectifier junction together with the second semiconductor region; and a common insulated gate formed on a first channel forming region defined in the surface of the first semiconductor region between the surface of the second semiconductor region and the first conductive region and on a second channel forming region defined in the surface of the second semiconductor region between the surface of the first semiconductor region and the second conductive region.

7. A photoelectric cell according to claim 6, wherein the first semiconductor region is formed contiguously with a second conduction type third semiconductor region, and a thickness of a portion of the first semiconductor region between the second semiconductor region, and the third semiconductor region is smaller than a length of one side of a pixel.

* * * * *